(12) United States Patent
Yip et al.

(10) Patent No.: US 9,425,113 B2
(45) Date of Patent: Aug. 23, 2016

(54) PACKAGE FOR HIGH FREQUENCY CIRCUITS

(71) Applicants: Jim Yip, Malvern (GB); Paul Rice, Worcester (GB); Mark Black, Towcester (GB)

(72) Inventors: Jim Yip, Malvern (GB); Paul Rice, Worcester (GB); Mark Black, Towcester (GB)

(73) Assignee: Radio Physics Solutions, Ltd., Birmingham (GB)

( * ) Notice: Subject to any disclaimer, the term of this patent is extended or adjusted under 35 U.S.C. 154(b) by 70 days.

(21) Appl. No.: 14/346,788

(22) PCT Filed: Sep. 19, 2012

(86) PCT No.: PCT/EP2012/068407
§ 371 (c)(1),
(2) Date: Mar. 24, 2014

(87) PCT Pub. No.: WO2013/041554
PCT Pub. Date: Mar. 28, 2013

(65) Prior Publication Data
US 2014/0231117 A1    Aug. 21, 2014

(30) Foreign Application Priority Data
Sep. 23, 2011 (GB) ................... 1116415.9

(51) Int. Cl.
*H01L 23/02*    (2006.01)
*H01L 23/04*    (2006.01)
(Continued)

(52) U.S. Cl.
CPC .............. *H01L 23/04* (2013.01); *H01L 23/552* (2013.01); *H01L 23/66* (2013.01); *H01L 2223/6683* (2013.01); *H01L 2924/0002* (2013.01)

(58) Field of Classification Search
CPC ........ H01L 23/04; H01L 23/552; H01L 23/66
USPC ......................................... 257/275, 678, 728
See application file for complete search history.

(56) References Cited

U.S. PATENT DOCUMENTS

| 5,933,120 | A | 8/1999 | Manasson et al. |
| 6,163,072 | A * | 12/2000 | Tatoh ...................... H01L 23/66 257/433 |
| 6,217,210 | B1 | 4/2001 | Roeder et al. |

(Continued)

FOREIGN PATENT DOCUMENTS

| JP | 53010948 A | 1/1978 |
| JP | 06236935 A | 8/1994 |

(Continued)

OTHER PUBLICATIONS

Kukhling; perevod s nemetskogo; pod redaktsiei E.M. Leikina Published by Moskva: "Mir" is a 519 page Russian Translation of the 15th edition of Physik 4 pages (1980).

(Continued)

*Primary Examiner* — S. V. Clark
(74) *Attorney, Agent, or Firm* — Reza Mollaaghababa; Thomas J. Engellenner; Pepper Hamilton LLP

(57) ABSTRACT

The present invention relates to integrated circuit packaging and methods of manufacturing these. In particular, but not exclusively the present invention relates to improvements in the suppression of spurious wave modes within cavity packages in which are mounted circuits operating at high frequencies, for example Monolithic Microwave Integrated Circuits (MMIC's).

18 Claims, 7 Drawing Sheets

(51) Int. Cl.
*H01L 23/552* (2006.01)
*H01L 23/66* (2006.01)

(56) References Cited

U.S. PATENT DOCUMENTS

| | | | |
|---|---|---|---|
| 6,862,001 | B2 | 3/2005 | Kondoh et al. |
| 8,593,157 | B2 | 11/2013 | Adams et al. |
| 8,633,442 | B2 | 1/2014 | Tomioka |
| 2002/0113300 | A1 | 8/2002 | Dautartas et al. |
| 2007/0046525 | A1 | 3/2007 | Holbrook et al. |
| 2008/0129581 | A1 | 6/2008 | Douglass et al. |
| 2008/0266830 | A1 | 10/2008 | Woods |
| 2008/0311682 | A1 | 12/2008 | Adlerstein et al. |
| 2009/0135051 | A1 | 5/2009 | Bishop et al. |
| 2009/0315461 | A1* | 12/2009 | Neate ............ H01J 65/044 315/39 |
| 2010/0038776 | A1 | 2/2010 | Bessemoulin |
| 2011/0103800 | A1 | 5/2011 | Shinada et al. |
| 2012/0062411 | A1 | 3/2012 | Shylo et al. |
| 2012/0261576 | A1* | 10/2012 | Tomioka ............ G01J 3/36 250/338.1 |

FOREIGN PATENT DOCUMENTS

| | | |
|---|---|---|
| JP | 2004103948 A | 4/2004 |
| UA | 56347 C2 | 5/2003 |
| UA | 85932 C2 | 6/2007 |

OTHER PUBLICATIONS

Boudouris, Georges et al. "Ultra-High Frequency Chains (Theory and Application)" Translation from French/Editor A.L. Zinovieva—M.:Sov. Radio, 288, pp. 129-130.

International Search Report, PCT/EP2012/068407, mailed Jan. 28, 2013 (3 sheets).

United Kingdom Search Report, GB1116415.9, mailed Jan. 26, 2012 (2 sheets).

Andrenko, S.D. et al. "Antenna Array of Millimeter Waves", Doklady Akademii nauk USSR, Proceedings of the Academy of Sciences of USSR, vol. 240, No. 6, pp. 1340-1343 (1978).

Andrenko, S.D. et al. Skaniruyuschaya Antenna Samoletnogo Radiometricheskogo Kompleksa (Scanning Antenna of the Aircraft Radio Physical Complex), Radiofizicheskiye Metody I Sredstva Dlya Issledovaniyaokruzhauyschey Sredy V Millmetrovom Diapazone: Sb.nach. tr.-Kiev: Nauk. dumka, pp. 154-160 (1988).

Boudouris, Georges et al. "Ultra-High Frequency Chains (Theory and Application)" Translation from French/Editor A.L. Zinovieva—M.:Sov. Radio, 288, pp. 129-130.

Goldsmith, P.F., et al. "Focal Plane Imaging Systems for Millimeter Wavelengths", IEEE Transactions on Microwave Theory and Techniques, vol. 41, No. 10, pp. 1664-1675 (Oct. 1993).

Hersman, Michael S. "Sensitivity of the Total Power Radiometer With Periodic Absolute Calibration", IEEE Transactions on Microwave Theory and Techniques, vol. 29, No. 1, pp. 32-40 (1981).

Andrenko, S.D. et al. "Conversion of Millimeter and Submillimeter Surface Electromagnetic Waves Into the Volume Waves and This Phenomenon Utilization in Physics and Engineering", The Bulletin of Ukrainian Academ of Sciences, No. 1, Sichen, pp. 8-21 (1977).

Bronshtain, I.N. and Semendyaev, K.A., (Handbook in Mathematics for Engineers and Students), pp. 233-234 (1981).

Shilo, S.A. and Sidorenko, Yu. B. "Millimeter Wave Imaging System", Symposium Proceedings, Kharkov, Ukraine, IEEE, pp. 455-457 (Jun. 2007).

Yevdokymov, Anatoliy P. and Kryzhanovskiy, Volodymyr, V. "The Scanning Antenna for a 3-MM Multichannel Radiometer", IEEE International Conference on Antenna Theory and Techniques, pp. 307-309 (Sep. 9-12, 2003).

International Preliminary Report on Patentability for PCT/GB08/051218, dated Feb. 15, 2011.

\* cited by examiner

PACKAGE FOR HIGH FREQUENCY CIRCUITS

The present invention relates to integrated circuit packaging and methods thereof. In particular, but not exclusively the present invention relates to improvements in the suppression of spurious wave modes within cavity packages in which are mounted circuits operating at high frequencies, for example Monolithic Microwave Integrated Circuits (MMIC's).

BACKGROUND TO THE INVENTION

Radio communication systems, radar systems and image recognition systems are well known. Examples of such radio communication systems are broadband radio communication systems that transmit high data rates to and from customer premises, or that are utilized to connect a transmitter to a single or to multiple receivers. Examples of such radar systems include those used in military or civilian applications for the tracking of distant objects, such as aircraft or vessels, or those used within automobiles for tracking other vehicles on a highway to ensure that a safe distance is maintained at all times. Examples of such imaging systems include those used for screening vehicles or persons as an integral part of Homeland security initiatives.

The majority of the above examples operate with frequencies that are in the range of from 10 to 100 or 200 GHz, and utilize MMIC's comprising multiple circuit elements constructed on a single substrate. In many cases the MMIC is accompanied by additional discrete circuit elements that improve the performance of the overall system. Examples of such systems include multiple stage amplifiers used to amplify low level signals, for example a passive imager. Other examples of high frequency packaged systems include combined transmit/receive subsystems within a single cavity package, used for example in a radar system where a one needs to transmit and receive signals at similar frequencies.

As a result of the limited signal levels and the operating wavelengths associated with the above systems, there is a requirement to provide significant gains within the associated receiving system. These high gains are traditionally achieved using cascaded low noise amplifiers and filter chains which result in the associated circuit elements being sensitive to interference from parasitic noise that may be present within (or external to) the package. In addition, to operate at the high frequencies required, it is necessary to maintain relatively small distances between critical components integrated onto a single (or a limited number) of MMIC's contained in a single package. Such high gains and small distances place constraints on the design and the method of manufacturing the receiving elements of the above systems. Unwanted effects due to spurious radio frequency energy may couple into the MMIC's and be subject to positive feedback where energy is coupled from one section of the MMIC to another causing either a degradation in performance, or at the extreme, total failure of the system. Thus care must be taken both when designing the MMIC's and when placing them within the high frequency package to ensure that any spurious radio frequency energy present within the package is kept to a minimum.

European patent application EP1719175 (Powell) discloses the possible existence of resonant spurious energy in the form of standing waves present within a cavity package. This application discloses that the mode and resonant frequency of the spurious wave are determined by the dimensions of the package which encloses the circuit. Specifically one can obtain multiple standing waves within a given package depending on the dimensions. In cases where the resonant frequency associated with the standing waves lies within the operating bandwidth of the MMIC's contained within the package, there is a possibility of radiated energy coupling into sensitive parts of the circuitry causing degradation in its performance. One can also experience energy coupling from one part of a circuit to another via such standing waves. There also exists a danger of oscillation occurring in the case of coupling from the output of an amplifier to the input of the amplifier, or the input of other earlier stages of a number of cascaded amplifiers, or into critical passive elements associated with the amplifier.

Traditional methods of overcoming the problem of spurious oscillations include, for example, reducing the gain of each stage of the MMIC amplifier chain. Such a remedy has the unwanted effect of reducing the overall performance of the circuit. An alternative method of reducing the coupling spurious radio frequency energy is to introduce damping material such as foam into the cavity formed by the package. Another method of reducing the coupling of energy between, for example, a transmitter section to a receiver section of a complex MMIC is to use a low resistance shield which is connected via a low impedance path to the system ground.

Several methods and apparatus for reducing the feedback due to coupling of unwanted energy that may take place within the cavity of the package have been described in the art. For example international patent application number WO92/11665 titled 'Three-dimensional microwave circuit carrier and integrated waveguide coupler', Leicht et al. describes a method for shielding one MMIC from another using conductive screen(s) molded into the plastic lid of a non-hermetic package. The conductive screens are connected to earth via receiving posts on the MMIC substrate and may be attached with a conductive epoxy. The disadvantages of such a method are that it is limited to applications where there are multiple MMIC's comprising the gain stages of a receiver and the lid cannot be removed without damaging the MMIC. More importantly, such assemblies must be specifically designed for one/each application. This method also increases the spacing between the amplifiers comprising the system, thus limiting the maximum frequency at which the system can operate. The operation requires good ground contact being made between the underlying substrate and the conductive screens. In practice such a good ground contact may not be readily achieved due to manufacturing tolerances and/or parasitic inductance associated with the receiving posts on the MMIC substrate.

Another method is described by Uematsu Hiroshi et al in EP0798782 titled 'Packaging for Microwave Circuits'. This application relates to the use of a dielectric spacer mounted directly on the module carrier on which the MMIC circuits are positioned. The dielectric spacer is intended to prevent the occurrence of coupling of unwanted RF between one MMIC and another. However it would be apparent to one skilled in the art that the dielectric spacers do not limit the occurrence of spurious wave mode within a cavity package. The use of dielectric within a cavity package also has the effect of making the package electrically larger, thus lowering the resonant frequencies associated with the package which may as a result be modified to an extent that they lie within the operating bandwidth of the active circuit. Another disadvantage of such a method is that it is limited to applications where there are multiple MMIC's comprising the gain stages of a receiver. The use of spacers also increases the distance between the MMIC, thus limiting the maximum frequency of operation.

Within the U.S. Pat. No. 5,416,668, Benzoni describes a novel method of constructing a well grounded shield between two distinct circuit elements comprising a high frequency transmitting/receiving system. The system utilizes a conductive shield, constructed as part of the lid of the package. The shield is earthed to the side walls of the cavity of the package utilizing integral mounting posts when the two section pieces of the package are assembled together. Thus the shield effectively prevents leakage of radio frequency energy from one sub cavity to another. However, the method fails to prevent or reduce the formation of parasitic standing waves within sub cavities formed by the shield, for example as described by Powell. The system also only operates if one can electrically isolate sub-elements of a complex system from each other without the shield interfering with the desired performance. Thus one can conclude that the ideas presented by Benzoni are limited in their range of applications, do not reduce energy associated with parasitic standing waves, and the shielding member(s) (and associated package) need to be custom designed for a specific system.

U.S. Pat. No. 5,608,188 (Multi Compartment Electromagnetic Energy Shield) in the name of Choon et al. discloses a method of constructing a well grounded shield between two distinct circuit elements comprising a high frequency transmitting/receiving system. The system utilizes a floating shielded member to ensure that the base of the shield is in close contact with an earth stripe that is placed between the two distinct parts system housed within the package. Thus, in a similar manner to that described by Benzoni, the shield effectively prevents leakage of radio frequency energy from one sub-cavity to another. To operate, the shield described by Benzoni is also dependent on the ability of electrically isolate sub element of a complex system one from the other without the shield interfering with the desired performance. Thus one can conclude that the ideas presented by Choon et al. are limited in their range of application, do not reduce energy associated with parasitic standing waves, and the shielding member(s) and associated MMIC again need to be custom designed for a specific system.

Within U.S. Pat. No. 6,862,001 titled 'High Frequency Communication Device' Kondoh et al. describe an alternative method for reducing the coupling of radio frequency energy from one circuit element to another utilizing a filter. Within the patent Kondoh et al describe the regular structure that reduces radio energy at the operating frequency of the enclosed MMIC and not spurious energy that is associated with the package itself. The frequency at which the filter operates is defined by the mark space ratio of the periodic mechanical structure that is built into the lid of package, and is specifically designed to coincide with the frequency of operation of the underlying circuitry. However, the structure can modify the desired operation of the underlying circuitry if the lower extremity of the periodic structure is in close proximity to the surface of the active circuitry. From the description presented it is clear that the filter is intended to reduce coupling of energy from one part of a circuit to another at the operating frequency of the underlying circuitry. Thus the periodic structure that forms the filter has to be specifically designed in conjunction with the MMIC.

US patent application number US20050274932 titled 'Shielding for Electromagnetic Interference' by Knight et al., presents an alternative method of reducing the energy coupling from one circuit element to another within a multiple MMIC system. The concept focuses on the use of a composite liquid crystal polymer loaded with an electrically conductive material to form a shield that is thermally matched to a low cost plastic cavity package. Knight et al. describe the action of designing the shielding member such that the lower extremity lies within a fraction of a wavelength of the underlying substrate onto which the active circuits are mounted. Maintaining such a minimum distance is intended to limit the leakage of radio frequency energy from one sub cavity to another at the operating frequency of the enclosed circuitry. Knight et al. further describe the anisotropic nature of the conductive material forming the shield which reduces the potential effect of the shield on the desired operation of the circuit elements. Although the structure described will reduce the coupling of energy (at the operating frequency) from one sub cavity to another, the shield and the underlying circuits have to be specifically designed in conjunction with each other to ensure that the shield does not impact the desired operation of the system.

As mentioned previously, Powell et al. (EP1719175), discloses the existence of a 'spurious wave mode' within the cavity of a high frequency package. The spurious wave is attributed to the resonant frequency of cavity dimensions and the associated materials. Powell et al. further describe a method and apparatus for limiting the amount of energy present in such spurious modes utilizing a resistive coated structure tuned to the impedance of the wave that one would experience if the structure were not present.

The use of the resistively coated structure reduces the effect of the interaction of such 'spurious wave mode' with sensitive parts of the enclosed circuitry. Powell et al. define that a number of different modes of different frequencies can be experienced within a cavity package, all of which are dependent on the dimensions of the cavity and describe the use of one or more partially conducting vane(s) protruding into the package cavity to reduce the energy associated with such waves. The number, size, orientation(s) of the resistive vanes are arranged to coincide with the points of maximum energy of the standing waves that would be present within the cavity if the vanes were not present. The resistance of the surface of the vanes is designed to match the impedance of the 'spurious wave mode' if the vanes were not present. Although the number, size, orientation and exact position of the vane(s) are stated to be of importance with regard to the extent to which the energy associated with a spurious mode wave is reduced, there are limitations as to the placement of the vanes to ensure that they do not interfere with the enclosed circuitry. In particular it is important to ensure that the dielectric structure onto which the resistive material is supported does not interfere with the operation of the system by loading sensitive areas of the underlying circuit. As with the disclosures mentioned above it is essential to design the resistive coated vanes in conjunction with the design of the enclosed MMIC.

Thus a key disadvantage of the methods and apparatus described by Powell is the accuracy required for placement of the vane(s), specifically to reduce higher order spurious wave modes. In addition, the dielectric structure supporting the resistive vane can either cause a loading effect on the circuitry or can themselves create new spurious wave modes which degrade the performance of a system that is operating at very high frequencies (i.e. >80-100 GHz).

Embodiments of the present invention seek to address one or more of the limitations of known packaging techniques and the systems outlined above and to preferably improve the performance thereof. More particularly, it is the aim of the present invention to provide a universal package for encapsulating high frequency electrical circuitry operating at frequencies above 10 GHz and which suppresses spurious wave modes within said package.

By use of the term 'universal' is meant that the package may be used with any high frequency electrical circuit (HFEC) and will function to suppress spurious wave modes regardless of the circuit that it used. The package or more specifically the damping structures therein act to suppress spurious wave modes in connection with any HFEC and such damping structures are not designed around a particular circuit. Thus, in contrast to the prior art packages, specific adaptations to, or prior knowledge of, the circuit design is not required for the damping structures to fulfill their role/function.

SUMMARY OF THE INVENTION

Particular and preferred aspects of the present invention are set out in the accompanying independent and dependent claims.

In a first aspect of the invention there is provided a package having a cavity for high frequency electrical circuits capable of generating resonant wave modes in a range of orientations within the cavity, the cavity formed within a first material for containment of the electrical circuit, wherein the package additionally comprises a second material extending into the cavity and comprising a plurality of discrete conductive regions that are configured to uniformly absorb all resonant wave modes across the range of orientations.

The second material forms at least one elongated member or projection which extends into the cavity, for example from a surface of the cavity such as the top which may be in the form of a 'lid' or from one or more sides of the package which form the cavity. In particular embodiments the second material forms at least one elongated member having or being of substantially polygonal cross-section. Such an elongated member will have a plurality of sides, for example, three, four, five, six or more. In some embodiments the sides will be substantially straight in cross-section. In other embodiments the sides will be curved or may form or comprise curves in cross-section. In yet other embodiments, the sides may comprise both straight and curved sides in cross-section. In other embodiments the second material forms at least one elongated member having a circular cross-section.

In particular embodiments the at least one elongated member is of gradually decreasing cross-section towards the apex thereof. Thus, such an elongated member may have an actual point or apex, for example being conical in shape or form. Alternatively, such an elongated member may be of gradually decreasing cross-section towards an imaginary or projected apex, for example, such as a cone or pyramid whose tip has been truncated by a plane substantially parallel to its base. The elongated member(s) may be cylindrical. In certain embodiments, the package may comprise elongated members having different shapes, sizes, volumes and/or cross-sections.

Preferably the shape of the at least one elongated member is one which has a high surface area. More particularly the shape may have a high surface area and a low or lower volume. It is also possible to increase the surface area of a shape which has smooth surfaces by introducing irregularities. Surface area may also be maximized by utilizing elongated members having an 'aerated' or sponge like appearance. Thus, the terms referring to shapes/forms/number of sides and the like are intended to be broadly descriptive and are not intended to exclude irregular shapes or forms that may be created, for example, for the purpose of increasing surface area.

In particular embodiments the package comprises a plurality of elongated members in an ordered array. In yet other embodiments the package comprises a plurality of elongated members in an unordered array. In still yet other embodiments the package comprises a plurality of elongated members some of which may be in an ordered array whilst others are in an unordered array. In still yet further embodiments the package comprises a plurality of elongated members that are randomly positioned.

In some embodiments the plurality of discrete conductive regions are positioned or formed such that when a circuit is contained within the package, such conductive regions will be at one or more oblique angles to any active circuits contained within the package.

In other embodiments the plurality of discrete conductive regions are positioned or formed such that when a circuit is contained within the package, such conductive regions will be substantially perpendicular to any active circuits contained within the package.

In still yet other embodiments the plurality of discrete conductive regions are positioned or formed such that when a circuit is contained within the package, some conductive regions will be at one or more oblique angles to any active circuits contained within the package whilst other conductive regions will be substantially perpendicular to any active circuits contained within the package Particularly the second material comprises a material selected from the group consisting of glass, plastic, ceramic, cardboard, metal and metalloid. Yet more particularly the second material comprises a material selected from the group consisting of alumina, aluminium, brass, boron, germanium, quartz, silicon and silicon dioxide. When the material is a plastic, preferably it is a thermoplastic. Other suitable materials include aerated polymers or gels.

In particular embodiments, the first and second materials comprise or are formed from the same material or materials. Alternatively, the first and second materials comprise or are formed from different materials. The first and second materials may be shaped or formed at substantially the same time or may be shaped or formed separately. When the first or second materials are shaped or formed separately they may be bonded or adhered together, for example, using techniques known in the art such as adhesives, welding or mechanical fixing and the like.

In particular embodiments the second material is formed by wet etching of silicon dioxide. In other embodiments the second material is formed by moulding, particularly injection moulding.

Preferably the second material forms or comprises at least one irregular surface. Such an irregular surface may be produced when the second material is shaped or formed. Alternatively such an irregular surface may be produced in a subsequent processing step, for example, by mechanical treatment such as drilling, sanding or abrasion or chemical treatment such as acid erosion. Preferably the at least one or plurality of discrete conductive regions are formed on the at least one irregular surface. In certain embodiments, the entire surface of the second material is a coated surface, the coating being or comprising the conductive region or regions.

In particular embodiments the discrete conductive regions are formed by electroplating of the second material. Suitable resistive materials for forming the conductive region or regions include nickel alloys such as nichrome and the like.

BRIEF DESCRIPTION OF THE DRAWINGS

FIG. 2b simulates the energy at different frequencies present within the simulated structure of FIG. 2a.

FIG. 3b simulates the energy at different frequencies present within the cavity package of FIG. 3a.

FIG. 4b is a simulation of the energy present at different frequencies within the cavity package of FIG. 4a.

DETAILED DESCRIPTION OF THE INVENTION

Specific embodiments of the invention will now be described, by way of example only, and with reference to the accompanying drawings.

Figure 1:
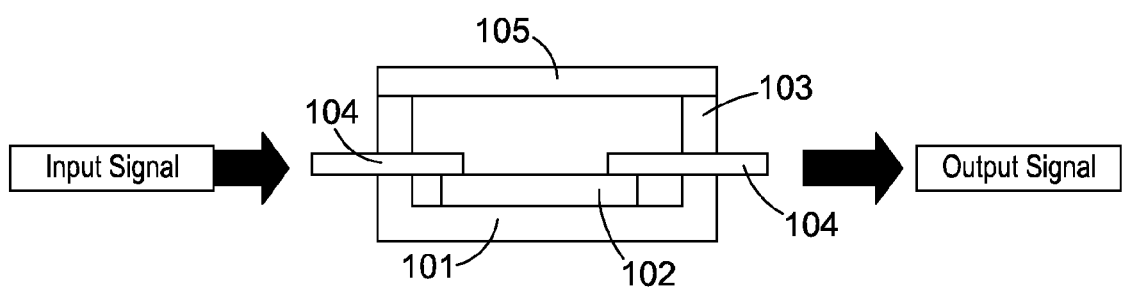
FIG. 1 Shows a typical cavity package in cross section housing a typical high frequency circuit e.g. a MMIC. The package typically contains a mounting plate (101) onto which one (or more) Monolithic Microwave Integrated Circuit (MMIC) (102) is mounted using an electrically conductive material. The mounting plate (101) is connected to the electrical ground of the system and is surrounded on four sides by conductive material to form a screened cavity (103). Typically the mounting plate and the side walls are formed from a single piece of highly conductive material. A number of electrical connections (104) are made to the MMIC via conductors that pass through, and are isolated from, the sides of the cavity. To complete the enclosure a lid of conducting material (105) is placed onto the cavity and is attached via a material or a method that provides a good electrical connection.

Various methods of manufacturing of high frequency circuits operating at frequencies in the range of 10 GHz to >100 GHz have been describes in the literature. As shown in FIG. 1, these high frequency circuits often contain a mounting plate or cavity (101) onto which one or more Monolithic Microwave Integrated Circuits (MMIC's) (102) are mounted. The mounting plate is connected to the electrical ground of the system surrounded on four sides by conductive material to form a screened cavity (103). A number of electrical connections (104) are made to the MMIC via conductors that pass through, and are isolated from, the sides of the cavity. To complete the enclosure, a lid of conducting material (105) is placed onto the cavity and is attached via a material that provides an electrical connection. The package of the present invention may incorporate these general features. In addition the lid may also form or comprise a hermetic seal to secure against the entry of water vapor and/or foreign bodies in order to maintain the proper functioning and reliability of the circuit(s) contained or enclosed within the package.

Figure 2A:
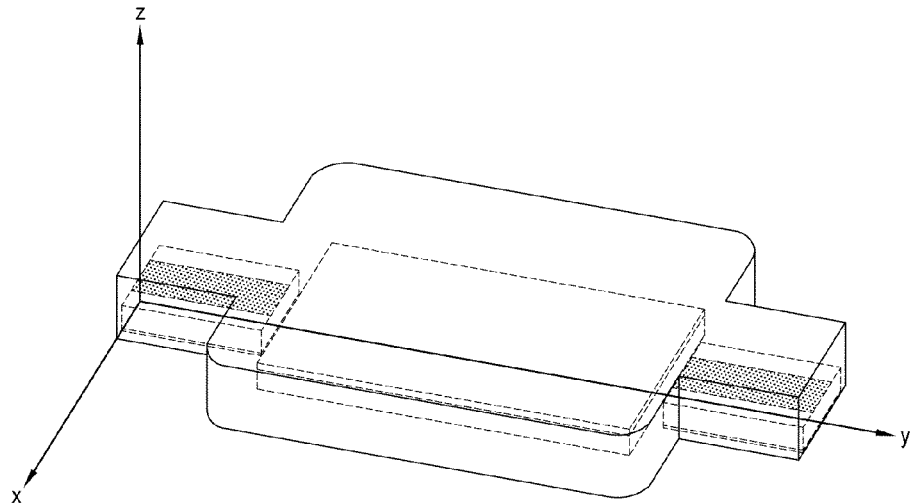
FIG. 2a shows a simulated structure for a cavity package.
Figure 2B:
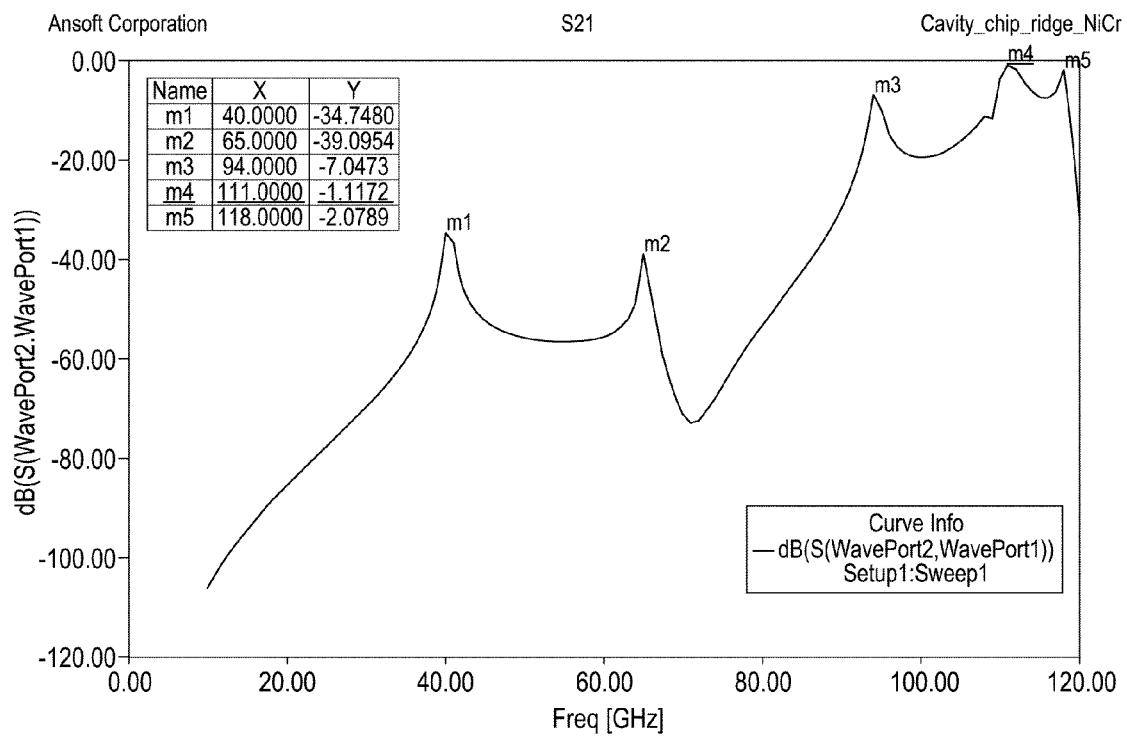

The possible existence of resonant spurious wave modes within a cavity package has previously been described in detail by Powell et al. As may be seen in FIGS. 2a and 2b the mode and resonant frequency of the spurious wave within the cavity are determined by the package dimension. In the simulated example there are two resonant cavity modes M1 at 60 GHz and M2 at 90 GHz.

In certain situations, where the resonant frequency (or frequencies) of the cavity lies within the operating bandwidth of the MMIC's (or support circuits) contained within the package, there is a possibility of energy associated with the spurious wave modes coupling into sensitive parts of the circuit, thus causing a degradation in performance. In the case of parasitic spurious mode energy coupling to the input stage of a high gain amplifier, there is danger of oscillation occurring. Such an oscillation would cause the operation of the circuit to degrade or fail.

Powell et al. describe in detail the method for utilizing a vane coated to reduce the energy associated with the spurious wave modes. The resistance of the partially conductive material is selected to match the impedance of the spurious wave which would exist if the resistively coated vane were not present. Powell et al. further describe the position of the vane(s) to coincide with the points where maximum energy of the spurious wave modes would be seen to occur.

Figure 3A:
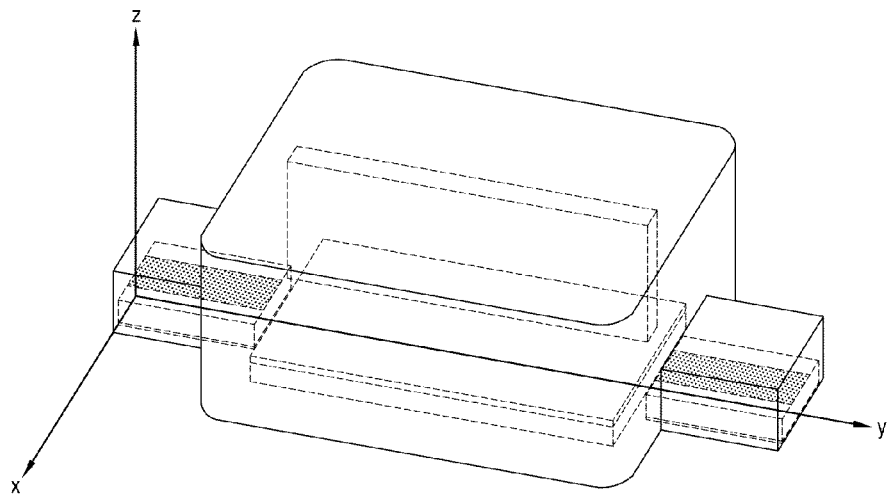
FIG. 3a is a simulated model of a cavity package into which a single resistively coated vane is placed according to the methodology of Powell et al.
Figure 3B:
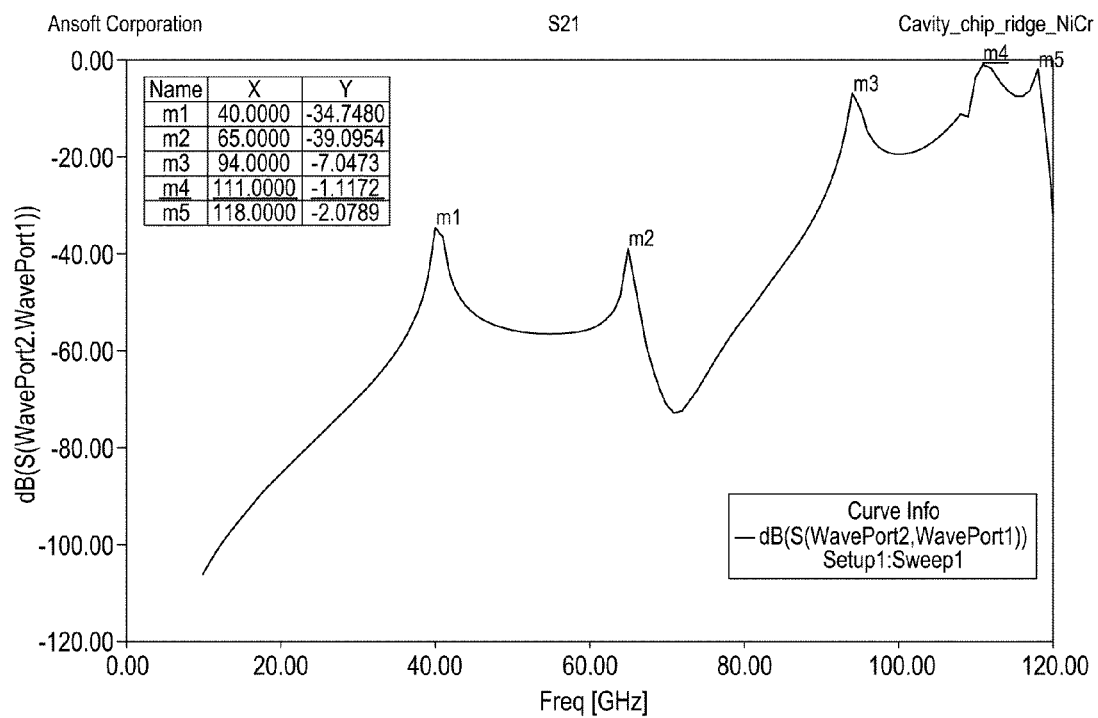

FIGS. 3a and 3b, demonstrate a single vane placed along the central axis of the cavity such that it coincides with the points of maximum energy of the spurious wave mode. As described by Powell et al, this single vane has the effect of significantly reducing the energy associated with the primary spurious wave mode. However, it can clearly be seen in FIG. 3b that the low dielectric structure onto which the resistive material is coated has the effect of increasing the effective dimensions of the cavity and thus reducing the resonant frequency, whilst also reducing the amount of energy present in the spurious wave mode. Furthermore a single vane positioned on the center axis of the package will only suppress even order spurious wave modes. Thus to fully suppress the spurious wave modes one would need to place additional resistive vanes within the package at locations (and in directions) where the points of maximum energy associated with higher order and both odd and even order spurious wave modes would exist.

By placing additional resistive vanes within the cavity as defined by Powell et al, one can suppress some modes, but one can also generate new higher order modes formed by the affect of the damping structure(s) and the underlying circuitry. For example, a spurious wave can be formed as a result of the formation of transmission paths between the bottom of the dielectric vanes (supporting the resistive coating) and the underlying MMIC. Under some circumstances these higher order modes, which are difficult to suppress, can be present within the operating bandwidth of the MMIC. For example it can be seen in FIG. 3b that a single vane has the effect of introducing a higher order spurious wave mode (M5), the frequency of which may extend into the operating bandwidth of the underlying circuit.

Figure 4A:
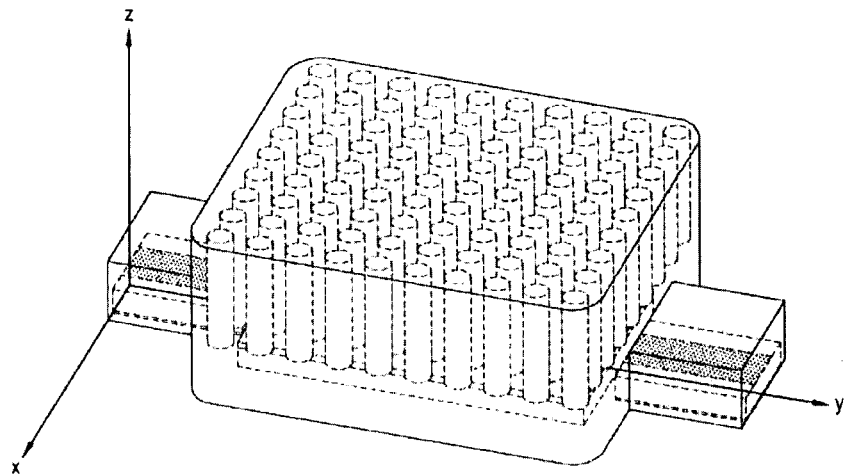
FIG. 4a is a damping structure according to the present invention which comprises a number of evenly spaced, resistively coated cylinders. The damping structure is shown within a typical cavity package.
Figure 4B:
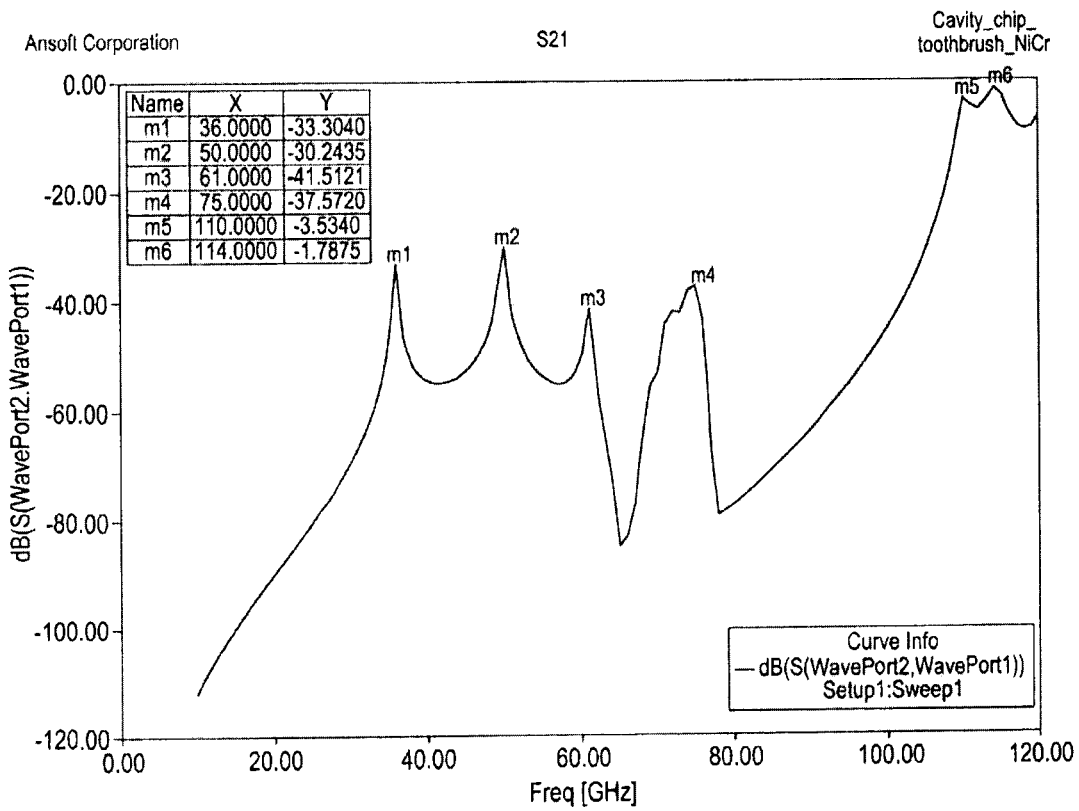

These new spurious modes are created by fields concentrated between the low dielectric structure necessary to support the resistive vane and the MMIC. The energy associated with these new higher order modes can be reduced by changing the support structure of the resistive material to the form of a field of cylinders evenly spaced within the cavity as shown in FIGS. 4a and 4b.

Figure 5A:
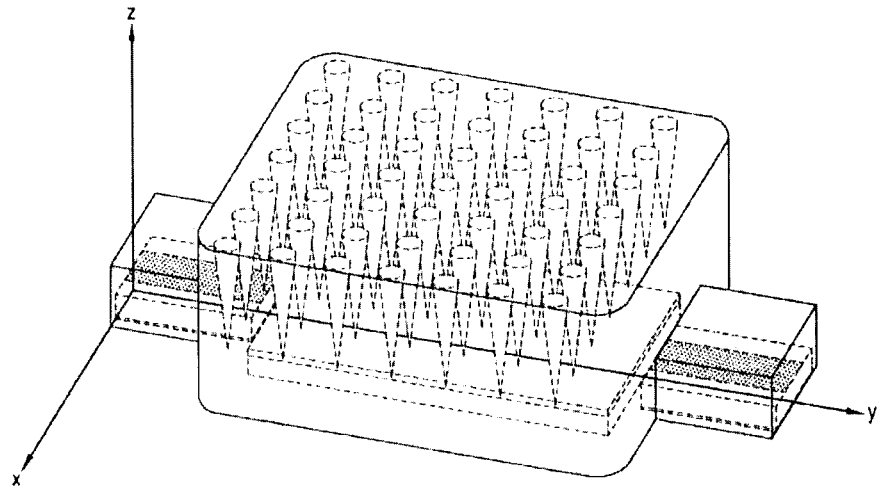
FIG. 5a exemplifies a further damping structure according to the present invention. In this instance the damping structure comprises a number of evenly spaced, resistively coated inverted cones.
Figure 5B:
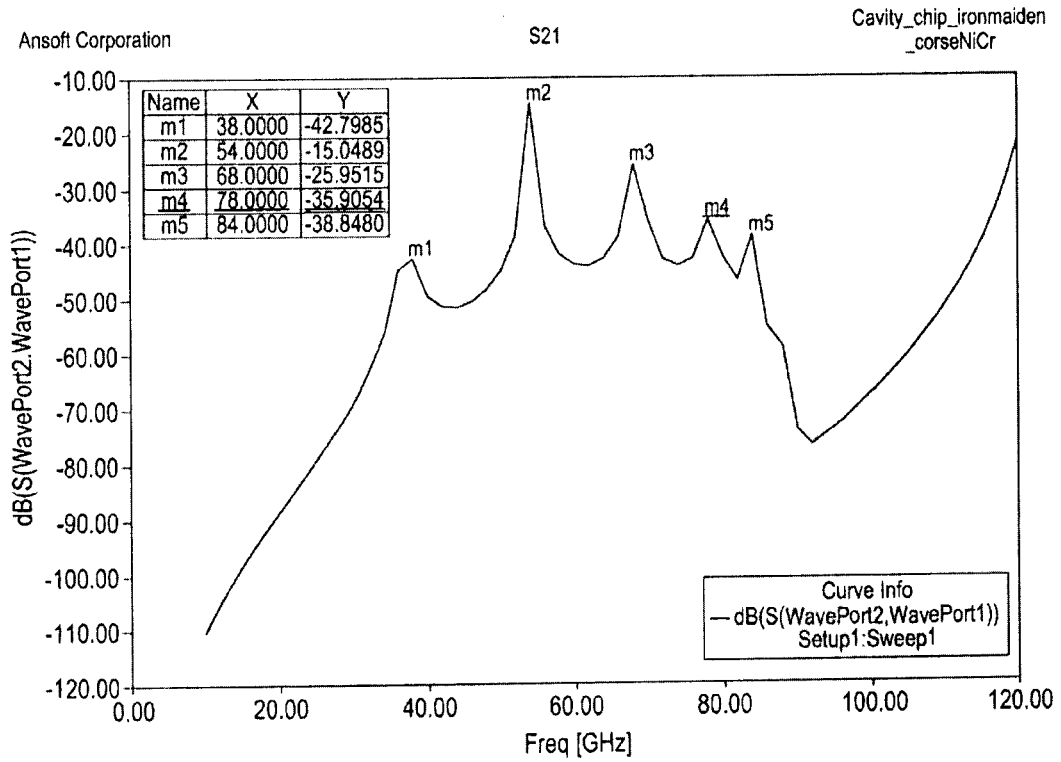
FIG. 5b is a simulation of the effect on energy at different frequencies within a cavity package into which the damping structure of FIG. 5a is deployed.
Figure 6A:
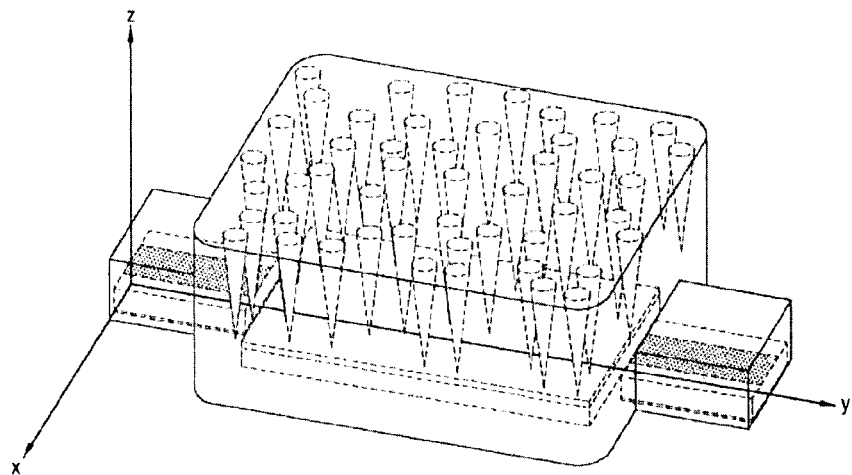
FIG. 6a exemplifies a further damping structure according to the present invention which comprises a number of randomly spaced, resistively coated inverted cones.
Figure 6B:
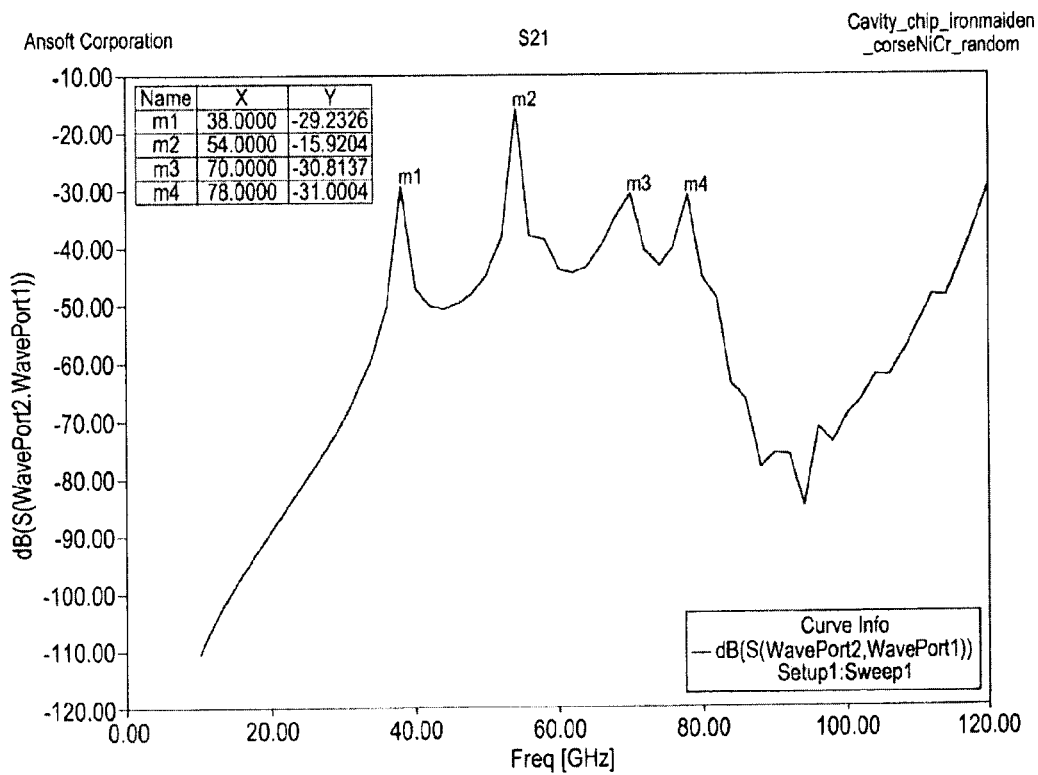
FIG. 6b is a simulation of the effect on energy at different frequencies within a cavity package into which the damping structure of FIG. 6a is deployed.
Figure 7:
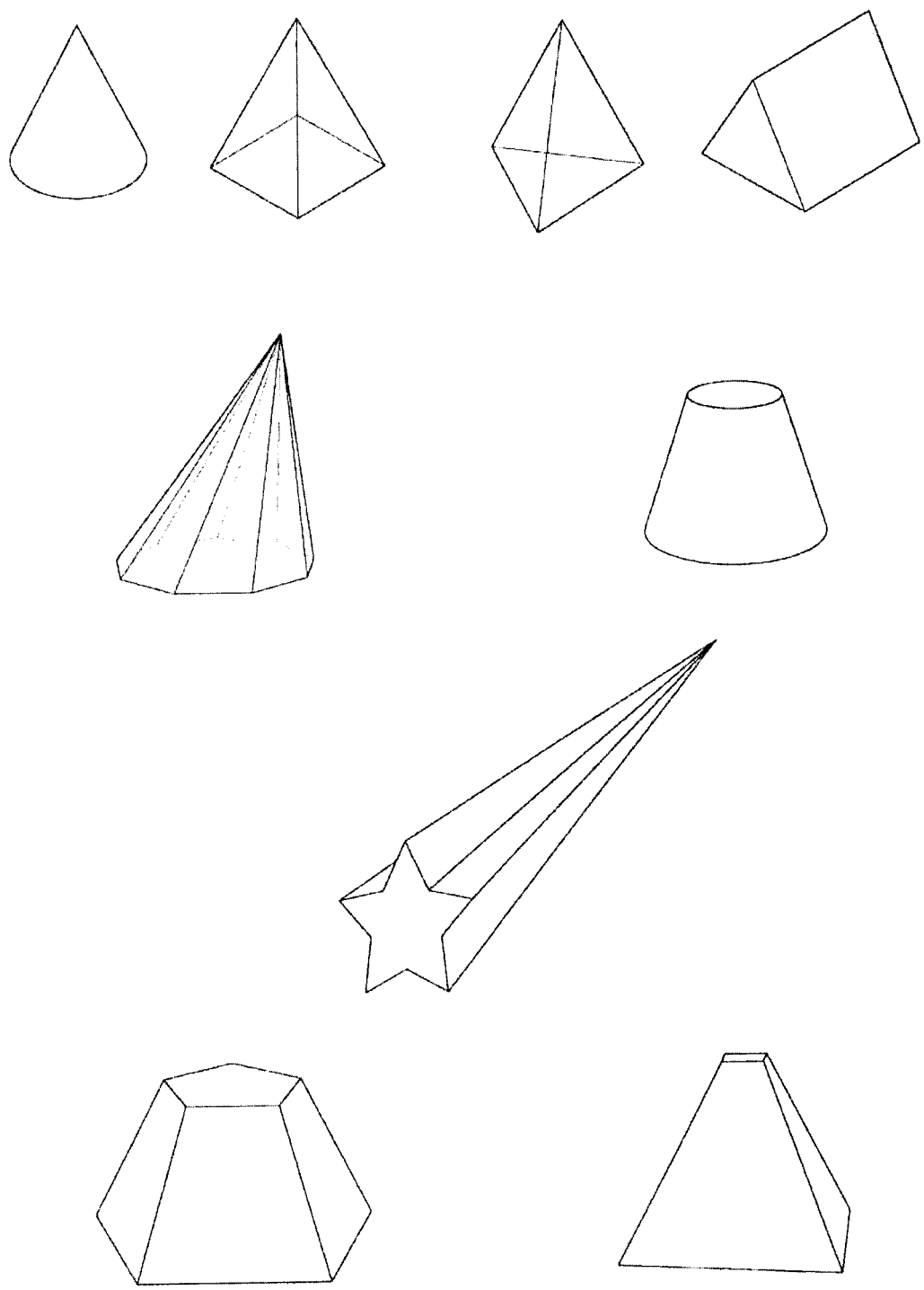
FIG. 7 exemplifies, by way of non-limiting example, a number of geometric shapes that the elongated members of second material may be formed into.

Further reduction in higher order spurious wave modes can be achieved by reducing the area of the three-dimensional structures that are in close proximity to the MMIC. The Inventors have discovered that this may be done by utilising three-dimensional structures having a gradually decreasing cross-section towards the apex, formed from a second material as defined above. For example, by using a number of inverted cones as shown in FIGS. 5a and 5b, or alternatively as shown in FIGS. 6a and 6b.

The use of the inverted cone structure(s) (as defined above) effectively reduces the volume of material that is in close proximity to the active MMIC, thus reducing any loading effect on sensitive parts of the circuit. Thus with this innovative step one can design a universal system for the suppression of spurious wave modes within a cavity package, whilst also reducing the energy associated with the loading of the damping structure itself on the underlying MMIC. It is evident from the simulated performance shown in FIGS. 5b and 6b, that with this innovation, one can design a universal damping system that can operate at high frequencies independent of the type of MMIC that is housed within the package cavity.

In both the case of the resistively coated cylinders and the resistively coated inverted cones, the material (second material) selected to form the shapes can be a low dielectric material such as a semiconductor, rather than a material as disclosed by Powell et al. In addition the resistive material (that forms the conductive regions) used to uniformly resistively coat the cylinders does not need to be specifically matched to the impedance of the original spurious wave mode. Thus the manufacturing of the resistively coated cylinders/cones can be realised using modern semiconductor processing techniques as further described below.

As described above the material utilised to manufacture the three-dimensional structures (e.g. a sequence of coated cylinders or inverted cones) can be of a form that is easily manufactured such as a semiconductor material. The advantage of semiconductor material is that many techniques have been previously developed to construct multiple instances of three-dimensional shapes in a single large silicon wafer (i.e. wafer scale manufacturing), which leads to higher reproducibility and lower manufacturing cost.

Examples of such wafer scale silicon manufacturing techniques that can be utilised to realise the structures defined above are for example:

Repeated deposition and wet etching of silicon dioxide onto a silicon substrate to form a three dimensional shape using techniques that similar to those used for the fabrication of micro machines. The use of wet etching techniques to manufacture 3D forms has been a standard process used within the semiconductor industry for 30-40 years and is widely reported in the literature. The manufacture of an isolated cone for example, may comprise the following steps:

1) Grow a thick layer of silicon dioxide onto the surface of a clean silicon substrate contained within an oxygen rich environment using a high temperature.
2) Spin on an even coating of a photo resistant layer.
3) Place in close proximity a photo mask in with a hole of diameter 'X' and illuminate with a light of a frequency that hardens the area of the photo resist that is in close proximity to the hole.
4) Remove the excess photo resist which is not hardened using a suitable liquid rinse (e.g. DI water).
5) Immerse the silicon substrate into a suitable liquid (e.g. Hydrofluoric acid) to remove the area of silicon dioxide that lies outside of the area protected by the hardened photoresist for a specific duration that is sufficient to remove the maximum amount of silicon dioxide whilst not undercutting below the hardened photoresist.
6) Rinse the etched silicon substrate in a suitable liquid (e.g. DI water) to remove excess acid.
7) Remove the hardened resist using a suitable liquid or etching process.
8) Repeat the process 1 & 2 above.
9) Place a second mask in close proximity to the patterned silicon wafer which has a hole (concentric with the hole in the first mask) which has a diameter which is smaller than the first hole (e.g. a diameter of 80% X).
10) Repeat the steps 4 through 8.
11) Repeat step 9 with third mask which a hole that is concentric to that within the first mask with a hole that is further reduced in size (e.g. 60% X).

From the process above it would be clear to one skilled in the art that one can build a structure of a specific height and of a specific form that is dependent on the relative shape of the holes that are contained within the photo masks. It is also apparent to one skilled in the art that one could utilize similar manufacturing techniques to build an array of structures of similar form.

Once the array of structures or elongated members is formed the array can be coated with a material of the required resistance using either deposition or electro plating.

Other methods of manufacture include:

Injection moulding of a plastic shape onto an underlying substrate. The plastic used for the injection is loaded with or comprises microspheres of a conductive material, to enable the shape to be subsequently electroplated with the resistive material.

The moulding of a shape directly onto a silicon substrate utilizing epoxy resin loaded with micro spheres of conductive material for example by way of the REEMO® UV replication processes (such as in EP1837166 and EP1542074). Once cured the resulting 3D shapes can be electroplated with the resistive coating.

Further information relating to silicone etching may be found at: www.virginiasemi.com/pdf/siliconetchingandcleaning.pdf (herein incorporated by reference and as an Appendix).

Wet-Chemical Etching and Cleaning of Silicon
January 2003
Virginia Semiconductor, Inc.
1501 Powhatan Street, Fredericksburg, Va. 22401
(540) 373-2900, FAX (540) 371-0371
www.virginiasemi.com, tech@virginiasemi.com

A INTRODUCTION

Research and manufacturing related to silicon devices, circuits, and systems often relies on the wet-chemical etching of silicon wafers. The dissolution of silicon using liquid solutions is needed for deep etching and micromachining, shaping, and cleaning. Also, wet-chemistries are often used for defect delineation in single crystal silicon materials. In this paper, a review of the typical wet-chemical recipes used by engineers is given. As many sources as possible have been used to present a concise listing of etchants and processes.

B WAFER CLEANING

A sequence of chemistries is typically used to clean silicon wafers. This sequence was first developed at the RCA laboratories, and is therefore often referred to as the RCA process. This chemical sequence does not attack the silicon material, but selectively removes the organic and inorganic contamination that resides on the wafer surface. The following is a typical RCA process; many variations to the ordering of the sequence and chemical ratios are used throughout the industry.

General Clean: A general cleaning is accomplished by using a mixture of Sulfuric Acid and Hydrogen Peroxide. Mixing these chemicals is dangerous and generates extreme heat. This industry standard clean removes organic and inorganic contamination from the wafer. 2-10 minute clean is recommended. Strong rinse in DI water is required after this cleaning step.

Particle Removal: A Megasonic clean (at about 70 C) in a 5:1:1 ratio mixture of DI water:Ammonium Hydroxide: Hydrogen Peroxide will remove silica and silicon particles from the wafer, as well as remove certain organic and metal surface contamination. 2-10 minute clean is recommended. Strong rinse in DI water is required after this cleaning step.

Oxide Removal: A 15-60 second dip in 1:20 HF:DI water will remove the native oxide layer and any contamination in the oxide from the wafer surface. HF is extremely dangerous and must be handled with great care. Strong rinse in DI water is required after this cleaning step.

Metal Contamination Removal: A Megasonic clean (at about 70 C) in a 6:1:1 ratio mixture of DI water:HCL: Hydrogen Peroxide will remove certain ionic and metal surface contamination. 2-10 minute clean is recommended. Strong rinse in DI water is required after this cleaning step.

Spin Rinse Dry: Wafers should be rinsed and dried in a standard spin-rinse dryer.

Megasonic agitation is commonly used with the chemical bath and most commonly with the particle removal step. Also, heavy DI rinse steps are used between each chemical treatment. DI rinsing may use dump-baths, over-flow baths, and spray-dump baths, as well as combinations. Proper removal of all cleaning chemistry with 18 MegaOhm DI water is critical and needed after each chemical bath. Any text book on the topic of semiconductor or silicon processing is an excellent resource for further information regarding the RCA cleaning process (for example see S. Wolf and R. Tauber, "Silicon Processing:Vol. 1", Lattice Press, CA, 1986).

There are commercially available premixed cleaning solutions that can be used directly to clean wafers and serve the same purpose of the RCA cleaning process. These chemicals typically achieve the function of several cleaning steps with one solution (see for example JT Baker, Baker Clean Solution).

C ANISOTROPIC KOH ETCHING

KOH is one the most commonly used silicon etch chemistry for micromachining silicon wafers.

1. Anisotropic KOH Etching Rates vs. Orientation

The KOH etch rate is strongly effected by the crystallographic orientation of the silicon (anisotropic). Table 1 relates silicon orientation-dependent etch rates ($\mu m\ min^{-1}$) of KOH to crystal orientation with an etching temperature of 70° C. Table 1 is taken directly from [1]. In parentheses are normalized values relative to (110).

| Crystallographic Orientation | Rates at different KOH Concentration | | |
|---|---|---|---|
| | 30% | 40% | 50% |
| (100) | 0.797 (0.548) | 0.599 (0.463) | 0.539 (0.619) |
| (110) | 1.455 (1.000) | 1.294 (1.000) | 0.870 (1.000) |
| (210) | 1.561 (1.072) | 1.233 (0.953) | 0.959 (1.103) |
| (211) | 1.319 (0.906) | 0.950 (0.734) | 0.621 (0.714) |
| (221) | 0.714 (0.491) | 0.544 (0.420) | 0.322 (0.371) |
| (310) | 1.456 (1.000) | 1.088 (0.841) | 0.757 (0.871) |
| (311) | 1.436 (0.987) | 1.067 (0.824) | 0.746 (0.858) |
| (320) | 1.543 (1.060) | 1.287 (0.995) | 1.013 (1.165) |
| (331) | 1.160 (0.797) | 0.800 (0.619) | 0.489 (0.563) |
| (530) | 1.556 (1.069) | 1.280 (0.989) | 1.033 (1.188) |
| (540) | 1.512 (1.039) | 1.287 (0.994) | 0.914 (1.051) |
| (111) | 0.005 (0.004) | 0.009 (0.007) | 0.009 (0.010) |

The (110) plane is the fastest etching primary surface. The ideal (110) surface has a more corrugated atomic structure than the (100) and (111) primary surfaces. The (111) plane is an extremely slow etching plane that is tightly packed, has a single dangling-bond per atom, and is overall atomically flat. As shown above, the strongly stepped and vicinal surfaces to the primary planes are typically fast etching surfaces.

2. KOH Etching Rates vs. Composition and Temperature

Table 2 relates silicon orientation-dependent etch rates of KOH to percent composition, temperature, and orientation. Table 2 is taken directly from [2]. As with all wet-chemical etching solutions, the dissolution rate is a strong function of temperature. Significantly faster etch rates at higher temperatures are typical, but less ideal etch behavior is also common with more aggressive etch rates. Also, heavy boron doping can significantly harden the silicon and sharply reduce the etch rate.

| Etchant | Temperature (°C.) | Direction (plane) | Etch rate ($\mu m\ min^{-1}$) | Remarks | Reference |
|---|---|---|---|---|---|
| 20% KOH: 80% $H_2O$ | 20 | (100) | 0.025 | Near Peak etch rate at the conc. across temperature | [3] |
| | 40 | (100) | 0.188 | | |
| | 60 | (100) | 0.45 | | |
| | 80 | (100) | 1.4 | | |
| | 100 | (100) | 4.1 | | |
| 30% KOH: 70% $H_2O$ | 20 | (100) | 0.024 | Smoother surfaces than at lower concentration Faster etch rate for (110) than for (100) | [3] |
| | 40 | (100) | 0.108 | | |
| | 60 | (100) | 0.41 | | |
| | 80 | (100) | 1.3 | | |
| | 100 | (100) | 3.8 | | |
| | 20 | (110) | 0.035 | | |
| | 40 | (110) | 0.16 | | |
| | 60 | (110) | 0.62 | | |
| | 80 | (110) | 2.0 | | |
| | 100 | (110) | 5.8 | | |
| 40% KOH: 60% $H_2O$ | 20 | (100) | 0.020 | | [3] |
| | 40 | (100) | 0.088 | | |
| | 60 | (100) | 0.33 | | |
| | 80 | (100) | 1.1 | | |
| | 100 | (100) | 3.1 | | |
| 20% KOH: 80% 4 $H_2O$: 1 IPA) | 20 | (100) | 0.015 | Lower etch rate Smoother Less undercutting Lower (100): (111) etch-rate ration | [3] |
| | 40 | (100) | 0.071 | | |
| | 60 | (100) | 0.28 | | |
| | 80 | (100) | 0.96 | | |
| | 100 | (100) | 2.9 | | |
| 44% KOH: 56% $H_2O$ | 120 | (100) | 5.8 | High Temperature | [4] |
| | | (110) | 11.7 | | |
| | | (111) | 0.02 | | |
| 23.4% KOH: 63.3% $H_2O$: 13.3% IPA | 80 | (100) | 1.0 | Sensitive to boron concentration | [5] |
| | | (110) | 0.06 | | |

D Anisotropic TMAH (Tetramethylammonium Hydroxide) Etching

Similar to KOH etching, TMAH is commonly used for fast removal and silicon micromachining 1. TMAH Etching Rates vs. Orientation The orientation dependence of the TMAH etch rate is similar to KOH and varies similarly in accordance to the atomic organization of the crystallographic plane. Table 3 relates silicon orientation-dependent etch rates of TMAH (20.0 wt %, 79.8° C.) to orientation. Table 3 is taken directly from [6].

|  | Etching rate | Etching rate ratio | |
| --- | --- | --- | --- |
| Orientation | ($\mu m\ min^{-1}$) | (i j k)/(100) | (i j k)/(111) |
| 100 | 0.603 | 1.000 | 37 |
| 110 | 1.114 | 1.847 | 68 |
| 210 | 1.154 | 1.914 | 70 |
| 211 | 1.132 | 1.877 | 69 |
| 221 | 1.142 | 1.894 | 69 |
| 310 | 1.184 | 1.964 | 72 |
| 311 | 1.223 | 2.028 | 74 |
| 320 | 1.211 | 2.008 | 73 |
| 331 | 1.099 | 1.823 | 67 |
| 530 | 1.097 | 1.819 | 66 |
| 540 | 1.135 | 1.882 | 69 |
| 111 | 0.017 | 0.027 | 1 |

2. TMAH Etching Rates vs. Composition and Temperature

Similar to KOH, the TMAH etch rate varies exponentially with temperature. Table 4 relates silicon orientation-dependent etch rates of TMAH to percent composition, temperature, and orientation. Table 4 is taken directly from [2].

| Etchant | Temperature (° C.) | Direction (plane) | Etch rate ($\mu m\ min^{-1}$) | Remarks | Resources |
| --- | --- | --- | --- | --- | --- |
| 5% TMAH: 95% $H_2O$ | 60 | (100) | 0.33 | | [7] |
| | 70 | | 0.48 | | |
| | 80 | | 0.87 | | |
| | 90 | | 1.4 | | |
| | 60 | (110) | 0.64 | | |
| | 70 | | 0.74 | | |
| | 80 | | 1.4 | | |
| | 90 | | 1.8 | | |
| | 60 | (111) | 0.026 | | |
| | 90 | | 0.034 | | |
| 10% TMAH: 90% $H_2O$ | 60 | (100) | 0.28 | | [7] |
| | 70 | | 0.41 | | |
| | 80 | | 0.72 | | |
| | 90 | | 1.2 | | |
| 2% TMAH: 98% $H_2O$ | 80 | (100) | 0.65 | | [8] |
| | | (111) | 0.41 | | |
| 5% TMAH: 95% $H_2O$ | 80 | (100) | 0.63 | | [8] |
| | | (111) | 0.013 | | |
| 10% TMAH: 90% $H_2O$ | 80 | (100) | 0.57 | | [8] |
| | | (111) | 0.014 | | |
| 22% TMAH in $H_2O$ | 90 | (100) | 0.9 | (110) is fastest without surfactant | [9] |
| | | (110) | 1.8 | | |
| | | (111) | 0.018 | | |
| 22% TMAH in $H_2O$ + 0.5% surfactant | 90 | (100) | 0.6 | (100) is fastest with surfactant | [9] |
| | | (110) | 0.12 | | |
| | | (111) | 0.01 | | |
| 22% TMAH in $H_2O$ + 1% surfactant | 90 | (100) | 0.6 | Surfactants effect saturates | [9] |
| | | (110) | 0.1 | | |
| | | (111) | 0.009 | | |

E EDP

Similar to KOH, EDP is often used for fast removal and silicon micromachining. Table 5 relates silicon orientation-dependent etch rates in EDP solutions to Temperature and Orientation.

| Etchant | Temperature (° C.) | Direction (plane) | Etch rate ($\mu m\ min^{-1}$) | Remarks | References |
| --- | --- | --- | --- | --- | --- |
| 500 ml $NH_2(CH_2)_2NH_2$: 88 g $C_6H_4(OH)_2$: 234 ml $H_2O$ | 110 | (100) | 0.47 | EDP 'T' etch Oldest EDP formula ER rises to >0.83 $\mu m$/min after exposure to oxygen | [10] |
| | | (110) | 0.28 | | |
| | | (111) | 0.028 | | |
| 500 ml $NH_2(CH_2)_2NH_2$: 160 g $C_6H_4(OH)_2$: 160 ml $H_2O$ | 115 | (100) | 0.45 | EDP 'F' etch Fast etch rate Must be used at high T to avoid residue | [11] |
| F etch above w/1.0 g $C_6H_4N_2$ | 115 | (100) | | Faster w/ pyrazine Less sensitive to oxygen Smoother | [11] |
| F etch above w/3.0 g $C_6H_4N_2$ | 115 | (100) | 1.35 | | [11] |
| 500 ml $NH_2(CH_2)_2NH_2$: 80 g $C_6H_4(OH)_2$: 3.6 $C_6H_4N_2$: 66 ml $H_2O$ | 50 | (100) | 0.075 | EDP 'S' etch Slower etch rate Suitable for lower temperature use without residue | [11] |
| | 75 | (100) | 0.22 | | |
| | 95 | (100) | 0.43 | | |
| | 105 | (100) | 0.57 | | |
| | 110 | (100) | 0.75 | | |

-continued

| Etchant | Temperature (°C.) | Direction (plane) | Etch rate (μm min$^{-1}$) | Remarks | References |
|---|---|---|---|---|---|
| 46.4 mol % NH$_2$(CH$_2$)$_2$NH$_2$: 4 mol % C$_6$H$_4$(OH)$_2$: 49.4 mol % H$_2$0 | 118 | (100) (110) (111) | | Stops on p$^{++}$ | [12] |
| 250 ml NH$_2$(CH$_2$)$_2$NH$_2$: 45 g C$_6$H$_4$(OH)$_2$: 120 ml H$_2$0 | 110 | (100) (111) | | | [13] |

F ISOTROPIC SILICON ETCHES

Often, isotropic etchants having dissolution rates independent of orientation are needed. These chemical mixtures tend to uniformly remove material, and are limited by the mass transport of chemical species to the crystal surface. The actual surface reaction rates are so great that variations to atomic structure do not alter the reaction speed relative to chemical transport.

Table 6 lists several common recipes and is taken directly from [14].

| Formula | Comments | Reference |
|---|---|---|
| HF, HNO$_3$ | See [14] p73 | |
| HF, HNO$_3$, H$_2$O or CH$_3$COOH | Various combinations give different etch rates | [15] |
| 900 ml HNO$_3$, 95 ml HF, 5 ml CH$_3$COOH, 14 g NaClO$_2$ | 15 μm/min | [16] |
| 745 ml HNO$_3$, 105 ml HF, 75 ml CH$_3$COOH, 75 ml HClO$_4$ | 170 A/sec | [17] |

-continued

| Formula | Comments | Reference |
|---|---|---|
| 50 ml HF, 50 ml CH$_3$COOH, 200 mg KMnO$_4$ (fresh) | Epi Etching 0.2 μm/min | [18] |
| 108 ml HF, 350 g NH$_4$F per L H$_2$0 | Epi Etching n type 0.2-0.6 ohm-cm; 0.43 A/min p type 0.4 ohm-cm; 0.45 A/min p type 15 ohm-cm; 0.23 A/min | [19] |

G SILICON DEFECT DELINEATION ETCHES

Certain chemical etchants are strongly dependent on defects, and defect structures in the single crystal silicon. These etchants are commonly used to high-light or delineate defects in the material.

Table 7 lists the most common defect delineation mixtures, and is taken directly from [14]

| | Formula | Name | Application | Shelf Life | Ref |
|---|---|---|---|---|---|
| 1 | 1 ml HF, 1 ml C$_2$O$_3$ (5M) | Sirtl | 111 Silicon Approx 5 min etch | 5 min | [20] |
| 2 | 1 ml HF, 3 ml HNO$_3$, 1 ml CH$_3$COOH | Dash | 111 oe 100 n or p (works best on p) Approx 15 hr etch | 8 h | [21] |
| 3 | 2 ml HF, 1 ml K2Cr$_2$O$_7$ (0.15M) | Secco | 100 or 111 silicon | 5 min | [21] |
| | 2 ml HF, 1 ml Cr$_2$O$_3$ (0.15M) | Secco | 100 or 111 silicon | 5 min | [21][20] |
| 4 | 200 ml HF, 1 HNO$_3$ | | P-N delineation | | [20] |
| 5 | 60 ml HF, 30 ml HNO$_3$ 60 ml H$_2$0 60 ml CH$_3$COOH, 30 ml (1 g CrO$_3$ to 2 ml H$_2$O) | Jenkins Wright | general use does not roughen defect free regions Approx 30 min etch | 6 wks | [21][20] [22] |
| 6 | 2 ml HF, 1 ml HNO$_3$, 2 ml AgNO$_3$ (0.65M in H20) | Silver | epitaxial layer faults | | [20] |
| 7 | 5 gm H$_5$IO$_6$, 5 mg Kl in 50 ml H$_2$O, 2 ml HF | Sponheimer Mills | Etch 5-20 seconds junction delineation | | [22] |
| 8 | Shipley 112° | | | | [23] |
| 9 | 6 ml HF, 19 ml HNO | | | | [23] |
| 10 | (150 g/l (1.5M) CrO$_3$ to H$_2$0) to HF 1:1 | Yang | | | [24] |
| 11 | 600 ml HF, 300 ml HNO$_3$ 28 g Cu(NO$_3$)$_2$, 3 ml H$_2$0 | Copper Etch | | | [25] |
| 12 | 1000 ml H$_2$O, 1 drop (1.0N) KOH 3.54 g kBr, .708 g KbrO$_3$ | | | | [25] |

-continued

| | Formula | Name | Application | Shelf Life | Ref |
|---|---|---|---|---|---|
| 13 | 55 g $CuSO_4$, $SH20$, 950 ml $H_20$, 50 ml Hf | Copper Displacement | | | [25] |
| 14 | 1 ml HF, 3 ml $HNO_3$ | White | 15 secs. PN Junction etch with stron light | | |
| 15 | 3 ml HF, 5 ml $HNO_3$, 3 ml $CH_3COOH$ | CP-4 | 10 sec-3 min P-N Junctions | | [26] |
| 16a | 25 ml HF, 18 ml $HNO_3$, 5 ml $CH_3COOH/.1Br2$ 10 ml $H_2O$, 1 g $Cu(NO_3)_2$ | SD1 | 2-4 min reveals edge and mixed dislocations | | [26] |
| 16b | 100 ml HF; .1 to .5 ml HNO3 | | P stain | | [26] |
| 16c | 50 ml dilute $Cu(NO_3)_2$ 1 to 2 drops HF | | N stain | | [26] |
| 16d | 4% NaOH add 40 NaClO until no $H_2$ evolution from Si | | 80° C. specimen thinning (float specimen on surface of etch) | | [26] |
| 17 | 300 ml $HNO_3$, 600 ml HF 2 ml $Br_2$, 24 g $Cu(NO_3)_2$ dilute 10:1 wtih $H_2O$ | Sailer | Etch 4 hr Epi Stacking Faults | | [27] |
| 18 | a) 1) 75 g $CrO_3$ in 1000 ml $H_2O$ mix 1 part 1) to 2 parts 48% HF<br><br>b) mix part 1) to 2 parts 48% HF to 1.5 parts $H_2O$ | Schimmel | Resistivity greater than .2 ohm-cm (111) oe (100) approx 5 min<br>Resistivity less than .2 ohm-cm | | |
| 19 | 5 g $H_5IO_6$, 50 ml $H_2O$, 2 ml HF, 5 mg Kl | Periodic HF | Junction Deliniation | | |

H CONCLUSION

There are many wet-chemical etch recipes known for etching silicon. These processes are used for a variety of applications including micromachining, cleaning, and defect delineation. The detailed behaviour and rate of the etchant will vary between laboratory environments and exact processes. However, the data and phenomena recorded above have been reported by many researchers and manufactures.

For further details the reader is encourage to fully explore the direct and indirect references sited.

I REFERENCES

[1] K. Sato et al. [Characterization of orientation-dependent etching properties of single-crystal silicon: effects of KOH concentration (*Sensors and Actuators A* 64 (1988) 87-93)]

[2] R. Hull [*Properties of Crystalline Silicon* (INSPEC, London, 1999)]

[3] H. Seidel, L. Cseprege, A. Heuberger, H. Baumgarel [*J. Electrochem. Soc.* (*USA*) vol. 137 (1990) p. 3626-32]

[4] D. L. Kendall [*Annu. Rev. Mater. Sci* (*USA*) vol. 9 (1979) p. 373]

[5] J. B. Price [*Semiconductor Silicon*—1973 Eds. H. R. Huff, R. R. Burgess (E;

[6] M. Shikida, K. Sato, K. Tokoro, D. Uchikawa [Dept. of Micro Systems Engineering, Nagoya University, Japan]

[7] O. Tabata, R. Asahi, H. Funabashi, K. Shimaoka, S. Sugiyama [*Sens. Actuators A* (*Switzerland*) vol. 34 (1992) p. 51-7]

[8] U. Schnakenberg, W. Benecke, P. Lange [*Proc. 1991 Int. Conf Solid-State Sensors and Actuators* (*Tansducers* '91) San Francisco, USA, 1991 (IEEE, New York, N. Y., 1991) p. 815-8]

[9] M. Sekimura [Proc. 12th IEEE Int. Micro-Electrical Mechanical Systems Conf. (MEMS 1999), Orlando, Fla., USA, p. 650-5]

[10] R. M. Finne, D. L. Klein [*J. ElectroChem. Soc.* (*USA*) vol. 114 (1967) p. 965-'70]

[11] A. Reisman, M. Berkenbilt, S. A. Chan, F. B. Kaufman, D. C. Green [*J. ElectroChem Soc.* (*USA*) vol. 126 (1979) p. 1406-14]

[12] E. Bassous [*IEEE Trans. Electron Devices* (*USA*) vol. ED-25 (1978) p. 1178]

[13] G. Kaminsky [*J. Vac. Sci. Technol. B* (*USA*) vol. 3 (1985) p. 1015]

[14] S. Walsh[*Wetch Etching for Semiconductor Fabrication*, Janus Ventures Inc.]

[15] B. Schwartz, H. Robbins [*J. ElectroChem Soc.* 10B, 365 (1961)]

[16] A. Stoller, R. Speers, S Opresko [*RCA Rev* 31, 265 (1970)]

[17] R. Blaha, W. Fahrner[*J. ElectroChem Soc* 123, 515 (1976)]

[18] M. Theunissen, J. Apples, W Verkuylen [*J. ElectroChem Soc* 117, 959 (1970)]

[19] W. Hoffmeister int. [*J. Appl Radiat Isot* 2, 139 (1969)]

[20] S. Ghandi ["VLSI Fabrication Principles", *Wiley Inter-Science* (1983)]

[21] K. Ravi ["Imperfections and impurities in Semiconductor Silicon", *Wiley* (1981)]

[22] T. Mills, E. Sponheimer [Precision VLSI Cross Sectioning and Staining" 1982 IEEE Proceedings]

[23] D. Elliot ["Integrated Circuit Fabrication Technology", *McGraw-Hill* (1982)]

[24] "Semi Spec Identification of Structures and Contaminents seen on Specular Silicon Surfaces" *ASTM*

[25] M. Jacques, ["The Chemistry of Failure Analysis", IEEE EDM (1979)]

[26] J. Heiss Jr., J. Wylie, U.S. Pat. No. 4,089,704 (1978)

[27] T. Chu, R. Keim Jr. [*J. ElectroChem Soc.* 122, 995 (1975)

The invention claimed is:

1. A package having a cavity for high frequency electrical circuits capable of generating resonant wave modes in a range of orientations within the cavity, the cavity formed within a first material for containment of the electrical circuit, wherein the package additionally comprises a second material comprising a plurality of elongated members of gradually decreasing cross-section towards an apex thereof, wherein each member extends into the cavity and comprises a partially conductive region, the plurality of members configured to uniformly absorb all resonant wave modes across the range of orientations, wherein the package is a universal system for suppression of resonant wave modes independent of the type of high frequency electrical circuit housed within the cavity.

2. The package of claim 1 wherein the second material forms at least one elongated member having a polygonal cross-section.

3. The package of claim 1 wherein the second material forms at least one elongated member having a circular cross-section.

4. The package of claim 1 wherein the at least one elongated member is conical in shape.

5. The package of claim 3, wherein said at least one elongated member comprises a plurality of elongated members in an ordered array.

6. The package of claim 3, wherein said at least one elongated member comprises a plurality of elongated members in an unordered array.

7. The package of claim 5 wherein in use the plurality of partially conductive regions are at oblique angles to any active circuits contained within the package.

8. The package of claim 5 wherein in use the plurality of partially conductive regions are perpendicular to any active circuits contained within the package.

9. The package of claim 1 wherein the second material comprises a material selected from the group consisting of glass, plastic, ceramic, cardboard, metal and metalloid.

10. The package of claim 9 wherein the second material is selected from the group consisting of alumina, aluminium, brass, boron, germanium, quartz, silicon and silicon dioxide.

11. The package of claim 9 wherein the first and second materials are the same.

12. The package of claim 9 wherein the second material is formed by wet etching of silicon dioxide.

13. The package of claim 9 wherein the second material is formed by moulding.

14. The package of claim 13 wherein the second material is formed by injection moulding.

15. The package of claim 1 wherein the second material forms an irregular surface.

16. The package of claim 15 wherein the partially conductive regions are electroplated.

17. The package of claim 2 which comprises a plurality of elongated members in an ordered array.

18. The package of claim 2 which comprises a plurality of elongated members in an unordered array.

* * * * *